(12) United States Patent
Inabe et al.

(10) Patent No.: US 7,892,722 B2
(45) Date of Patent: Feb. 22, 2011

(54) PATTERN FORMING METHOD

(75) Inventors: Haruki Inabe, Shizuoka (JP); Shinichi Kanna, Shizuoka (JP); Hiromi Kanda, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 1244 days.

(21) Appl. No.: 11/129,488

(22) Filed: May 16, 2005

(65) Prior Publication Data

US 2005/0255414 A1  Nov. 17, 2005

(30) Foreign Application Priority Data

May 17, 2004 (JP) .......................... P.2004-146023

(51) Int. Cl.
*G03F 1/00* (2006.01)
(52) U.S. Cl. .................. 430/311; 430/327; 430/322
(58) Field of Classification Search .................. 430/5, 430/312, 327, 311; 716/19, 20
See application file for complete search history.

(56) References Cited

U.S. PATENT DOCUMENTS

| | | | | |
|---|---|---|---|---|
| 4,346,164 | A | * | 8/1982 | Tabarelli et al. ............. 430/311 |
| 6,062,240 | A | * | 5/2000 | Sada et al. .................. 134/95.2 |
| 2002/0160319 | A1 | * | 10/2002 | Endo .......................... 430/327 |
| 2003/0064609 | A1 | * | 4/2003 | Iseki et al. .................. 438/782 |
| 2003/0118951 | A1 | * | 6/2003 | Nagase et al. ............... 430/331 |
| 2003/0203651 | A1 | * | 10/2003 | Davlin et al. ................ 438/782 |
| 2004/0038556 | A1 | * | 2/2004 | French et al. ................ 438/800 |
| 2004/0039153 | A1 | | 2/2004 | Elee et al. |
| 2004/0053158 | A1 | * | 3/2004 | Yamato et al. ........... 430/270.1 |
| 2005/0205108 | A1 | * | 9/2005 | Chang et al. .................... 134/1 |
| 2005/0221234 | A1 | | 10/2005 | Ito |
| 2006/0154188 | A1 | * | 7/2006 | Hirayama et al. ........... 430/338 |
| 2006/0167197 | A1 | | 7/2006 | Elee et al. |
| 2007/0010409 | A1 | | 1/2007 | Zhang et al. |
| 2007/0010412 | A1 | | 1/2007 | Zhang et al. |
| 2007/0177869 | A1 | | 8/2007 | Yamamoto |
| 2009/0190114 | A1 | | 7/2009 | Ito |

FOREIGN PATENT DOCUMENTS

| | | | |
|---|---|---|---|
| JP | 57-153433 | A | 9/1982 |
| JP | 63229452 | A * | 9/1988 |
| JP | 63-49893 | B2 | 10/1988 |
| JP | 6-124873 | A | 5/1994 |
| JP | 7-220990 | A | 8/1995 |
| JP | 08-314156 | A | 11/1996 |
| JP | 10-303114 | A | 11/1998 |
| JP | 2004-78217 | A | 3/2004 |
| JP | 2005-277053 | A | 10/2005 |
| JP | 2005-294520 | A | 10/2005 |
| JP | 2005-531680 | A | 10/2005 |
| JP | 2005-534956 | A | 11/2005 |
| WO | 2004/002955 | A2 | 1/2004 |

OTHER PUBLICATIONS

Switkes et al.; "Immersion Lithography at 157 nm"; J. Vac. Sci. Technol. B 19(6); c. 2001; American Vacuum Society; pp. 2353-2356.*
B.J. Lin, "Semiconductor Foundry, Lithography, and Partners", Proceedings of the SPIE, vol. 4688, 2002, pp. 11-24.
J.S. Hoffbagle, et al., "Liquid immersion deep-ultraviolet interferometric lithography", J. Vac. Sci. Technol. B, vol. 17, No. 6, Nov./Dec. 1999, pp. 3306-3309.
Japanese Office Action issued Aug. 17, 2010, in counterpart Japanese Patent Application No. 2005-135182.
Office Action on corresponding Japanese Application No. 2005-135182 dated Oct. 26, 2010.

* cited by examiner

*Primary Examiner*—Mark F Huff
*Assistant Examiner*—Rashid Alam
(74) *Attorney, Agent, or Firm*—Sughrue Mion, PLLC

(57) ABSTRACT

A pattern forming method includes (a) a step of forming a resist film on a substrate, (b) a pre-wet step of spreading a pre-wet solution on the resist film and after a fixed time, removing the pre-wet solution, and (c) a step of subjecting the resist film on the substrate to exposure through an immersion liquid.

13 Claims, No Drawings

PATTERN FORMING METHOD

This application is based on Japanese Patent application JP 2004-146023, filed May 17, 2004, the entire content of which is hereby incorporated by reference. This claim for priority benefit is being filed concurrently with the filing of this application.

BACKGROUND OF THE INVENTION

1. Technical Field of the Invention

The present invention relates to a pattern forming method utilizing a resist composition used in the process of producing a semiconductor such as IC or producing a circuit board of liquid crystal, thermal head or the like or in the lithography step of other photo-application processes. More specifically, the present invention relates to a pattern forming method utilizing a resist composition suitable for exposure by an immersion-type projection exposure apparatus using a light source of emitting far ultraviolet light at a wavelength of 300 nm or less.

2. Description of the Related Art

Along with the progress in the development of refined semiconductor devices, the trend is moving into shorter wavelength of exposure light source and higher numerical aperture (high NA) of projection lens. At present, exposure machines with NA of 0.84 have been developed, where an ArF excimer laser having a wavelength of 193 nm is used as the light source. As commonly well known, these can be expressed by the following formulae:

(Resolving power)=$k_1 \cdot (\lambda/NA)$ (Focal depth)=$\pm k_2 \cdot \lambda/NA^2$ wherein $\lambda$ is the wavelength of exposure light source, NA is the numerical aperture of projection lens, and $k_1$ and $k_2$ are constants related to the process.

In order to realize still shorter wavelength and higher resolving power, studies are being made on exposure machines where an $F_2$ excimer laser having a wavelength of 157 nm is used as the light source. However, the lens material used for the exposure apparatus so as to realize shorter wavelength and the material used for the resist are very limited and therefore, it is extremely difficult to stabilize the production cost or quality of the apparatus and materials. This may lead to a failure in procuring the exposure apparatus and resist having sufficiently high performance and stability within a required time period.

With respect to the technique of elevating the resolving power in optical microscopes, a so-called immersion method of filling a high refractive-index liquid (hereinafter sometimes referred to as an "immersion liquid") between the projection lens and the sample has been conventionally known.

As for the "effect of immersion", assuming that the wavelength of exposure light in air is $\lambda_0$, the refractive index of immersion liquid to air is n, the convergence half-angle is $\theta$ and $NA_0$=sin $\theta$, the above-described resolving power and focal depth when immersed can be expressed by the following formulae:

(Resolving power)=$k_1 \cdot (\lambda_0/n)/NA_0$ (Focal depth)=$\pm k_2 \cdot (\lambda_0/n)/NA_0^2$ That is, the effect of immersion is equal to use of an exposure wavelength of 1/n. In other words, in the case of a projection optical system with the same NA, the focal depth can be made n times larger by the immersion.

This is effective for all pattern profiles and can be combined with super-resolution techniques such as phase-shift method and modified illumination method which are being studied at present.

Examples of the apparatus where this effect is applied to the transfer of a fine image pattern of semiconductor device include those described in JP-A-57-153433 (the term "JP-A" as used herein means an "unexamined published Japanese patent application"), JP-A-7-220990, JP-B-63-49893 (the term "JP-B" as used herein means an "examined Japanese patent publication") and JP-A-6-124873, but these patent publications are not discussing on a resist suitable for immersion exposure techniques.

JP-A-10-303114 states that the control of refractive index of the immersion liquid is important, because change in the refractive index of immersion liquid causes deterioration of the projected image due to wavefront aberration of the exposure machine. This patent publication discloses a technique of controlling the temperature coefficient of refractive index of the immersion liquid to fall within a certain range and using, as a suitable immersion liquid, water where an additive of decreasing the surface tension or increasing the surface activity is added. However, the additive is not disclosed or the resist suitable for immersion exposure techniques is not discussed.

Recent progress of immersion exposure techniques is reported, for example, in *Proceedings of Society of Photo-Optical Instrumentation Engineers* (*Proc. SPIE*), Vol. 4688, page 11 (2002) and *J. Vac. Sci. Technol. B*, 17 (1999). In the case of using an ArF excimer laser as the light source, in view of safety on handling as well as transmittance and refractive index at 193 nm, pure water (refractive index at 193 nm: 1.44) is considered to be a most promising immersion liquid. In the case of using an $F_2$ excimer laser as the light source, a fluorine-containing solution is being studied in the light of balance between transmittance and refractive index at 157 nm, but those satisfied in view of environmental safety or refractive index have been not yet found out. Considering the degree of immersion effect and the maturity of resist, the immersion exposure technique is expected to be most soon mounted on an ArF exposure machine.

Since the discovery of resist for KrF excimer laser (248 nm), an image forming method called chemical amplification is used as the image forming method for the resist so as to compensate the reduction of sensitivity due to light absorption. According to this image forming method, for example, in the case of using positive chemical amplification, an acid generator in the exposed area decomposes upon exposure to generate an acid, the acid generated is used as a reaction catalyst in the post-exposure baking (PEB) to convert the alkali-insoluble group (group insoluble in alkali developer) into an alkali-soluble group (group soluble in alkali developer), and the exposed area is removed by an alkali developer.

When a chemical amplification resist is applied to the immersion exposure technique, the acid on the resist surface generated upon exposure moves to the immersion liquid, and the acid concentration on the surface of exposed area is changed. This may be considered to have a close resemblance to the acid deactivation occurring on the surface of exposed area due to basic contamination in a very small amount on the order of several ppb from the environment at the post-exposure time delay (PED) between exposure and PEB, which was a serious problem at the initiation of development of chemical amplification-type positive resist, but the effect of immersion exposure on the resist and also the mechanism thereof are not yet elucidated.

As for the immersion-type scanning exposure machine (scanner), two kinds of scanners have been proposed, that is, one is a full fill-type scanner of immersing the entire wafer in an immersion liquid (also called a bath-type scanner) and another is a local fill-type scanner of introducing an immersion liquid into only a space between the objective lens of exposure machine and the wafer (also called a shower-type scanner). Out of these scanners, the local fill-type scanner is admitted as the standard immersion scanner in view of high throughput and the like.

When exposure is performed by using the local fill-type immersion scanner, the time for which the resist film is in contact with the immersion liquid differs depending on the region in the wafer plane. In other words, a region which is repeatedly immersed in water is generated depending on the position in the wafer plane and this causes a fear that the resist performance is changed depending on the position, that is, the uniformity in the wafer plane is impaired. In practice, it is found that when a chemically amplified resist having no problem in the lithography performance at the process by a dry exposure technique is wet-exposed and after once removing the immersion liquid, subjected to a PEB step by again immersing it in an immersion liquid, the resist sensitivity decreases (has immersion time dependency) as compared with the case where the resist is wet-exposed and as-is subjected to a PEB step.

If a large amount of generated acid dissolves out from the resist surface into the immersion liquid at the immersion exposure, the objective lens of the exposure machine may be contaminated. Therefore, it is demanded to reduce the elution of generated acid as much as possible.

SUMMARY OF THE INVENTION

By taking account of these problems in conventional techniques, an object of the present invention is to provide a resist pattern forming method suitable for immersion exposure, where the immersion time dependency of resist sensitivity can be decreased and the amount of acid dissolved out into an immersion liquid can be reduced.

The present invention is the following resist process for immersion exposure and by this process, the above-described object of the present invention can be attained.

(1) A pattern forming method comprising (a) a step of forming a resist film on a substrate, (b) a pre-wet step of spreading a pre-wet solution on the resist film and after a fixed time, removing the pre-wet solution, and (c) a step of subjecting the resist film on the substrate to exposure through an immersion liquid.

(2) The pattern forming method as described in (1) above, wherein the pre-wet step (b) is a step of spreading a pre-wet solution on the resist film and after a fixed time, rotating the substrate to shake off and remove the pre-wet solution.

(3) The pattern forming method as described in (2) above, wherein in the pre-wet step (b), the fixed time after spreading a pre-wet solution on the resist film until removing the pre-wet solution is from 60 to 600 seconds.

(4) The pattern forming method as described in (2) or (3) above, wherein in the pre-wet step (b), the rotation speed at the time of rotating the substrate to shake off and remove the pre-wet solution is from 100 to 2,000 rpm.

(5) The pattern forming method as described in any one of (1) to (4) above, wherein (b') a step of removing the pre-wet solution penetrated into the resist film is provided after the pre-wet step (b).

(6) The pattern forming method as described in (5) above, wherein the step (b') of removing the pre-wet solution penetrated into the resist film is (b'1) a step of rotating the substrate to dry the resist film.

(7) The pattern forming method as described in (5) above, wherein the step (b') of removing the pre-wet solution penetrated into the resist film is (b'2) a step of heating the resist film on a hot plate at 40 to 150° C. to dry the resist film.

Furthermore, the present invention includes the following constitutions as preferred embodiments.

(8) The pattern forming method as described in (2) above, wherein in the pre-wet step (b), the fixed time after spreading a pre-wet solution on the resist film until removing the pre-wet solution is from 120 to 480 seconds.

(9) The pattern forming method as described in (2) above, wherein in the pre-wet step (b), the fixed time after spreading a pre-wet solution on the resist film until removing the pre-wet solution is from 180 to 300 seconds.

(10) The pattern forming method as described in (4) above, wherein in the pre-wet step (b), the rotation speed at the time of rotating the substrate to shake off and remove the pre-wet solution is from 500 to 1,000 rpm.

According to the present invention, a resist pattern forming method where the immersion time dependency of resist sensitivity in the immersion exposure is low and by virtue of decrease in the amount of acid dissolved out from the resist surface at the immersion exposure, the fear of contamination or corrosion of the immersion exposure machine is lessened, can be provided.

DETAILED DESCRIPTION OF THE INVENTION

The resist pattern forming method of the present invention is described in detail below.

As a result of intensive investigations to solve the problems at the immersion exposure, that is, to reduce the immersion time dependency of resist sensitivity and decrease the elution of generated acid from the resist surface, the present inventors have found that when a step of spreading a pre-wet solution on a resist film and after a fixed time, removing the pre-wet solution (in the present invention, this step is called a "pre-wet step") is added to the general resist pattern forming process in known immersion exposure techniques before the immersion exposure step, the above-described problems can be overcome.

As for the resist process used for the formation of a resist pattern in known immersion exposure techniques, a resist composition is uniformly coated by using a spin coating method to form a resist film, and the resist film is as it is subjected to immersion exposure through a mask having a desired pattern, post-exposure baked (PEB), cooled to room temperature, developed by way of immersion in a developer and after rinsing the developer with water, dried by a spin dry method.

The resist pattern forming method of the present invention is characterized in that the above-described pre-wet step is provided before the immersion exposure step in such a general pattern forming method.

The pre-wet step is a step of spreading a pre-wet solution on a resist film by a paddle system for a fixed time and then rotating the substrate to shake off and remove the pre-wet solution on the resist film.

It is presumed that when the pre-wet step is provided before the immersion exposure, the elution of photoacid generator from the resist film is saturated and therefore, the acid scarcely dissolves out at the subsequent immersion exposure. At the same time, even when the resist film is repeatedly immersed in an immersion liquid at the exposure, since the elution of acid from the resist film is already saturated, sensitivity difference hardly occurs (the immersion time dependency of resist sensitivity is decreased).

[Pre-Wet Solution]

The pre-wet solution for use in the pre-wet step is not particularly limited as long as it does not dissolve the resist film as the underlying layer, but the pre-wet solution is preferably water or a fluorine-based solvent, more preferably pure water which is satisfactorily deionized and deaerated. It is also preferred to use an immersion liquid for use in the immersion exposure step as the pre-wet solution.

In the pre-wet step, the time period after spreading the pre-wet solution on the resist until removing the pre-wet solution is preferably from 60 to 600 seconds, more preferably from 120 to 480 seconds, still more preferably from 180 to 300 seconds.

The temperature in keeping the spreading of pre-wet solution is preferably from 10 to 60° C., more preferably from 20 to 40° C.

In the pre-wet step, the substrate rotation speed at the time of rotating the substrate to remove the pre-wet solution after spreading the pre-wet solution on the resist film for a fixed time is preferably from 100 to 2,000 rpm, more preferably from 500 to 1,000 rpm, and most preferably from 750 to 900 rpm.

In the pattern forming method of the present invention, when (b') a step of removing the pre-wet solution penetrated into the resist film is performed after the above-described pre-wet step is applied to the resist film, the effect of the present invention increases and therefore, this is preferred.

As for the step (b') of removing the pre-wet solution penetrated into the resist film in the pre-wet step, (b'1) a method of rotating and thereby spin-drying the substrate or (b'2) a method of heating and thereby drying the resist film is preferably performed. These steps are preferred because a general apparatus for the production of a device such as semiconductor, liquid crystal and thermal head can be used, a new apparatus need not be introduced and the cost is practical. Also, drying with hot air may be performed by providing an apparatus capable of hot air drying in the exposure or developing machine or the like.

In the step (b'1) of rotating the substrate to remove the pre-wet solution, if the substrate rotation number is small, the wind velocity on the resist film surface becomes low and the drying takes much time. Therefore, the rotation number is preferably 500 rpm or more. As the rotation number is higher, the drying time can be more shortened and the throughput can be advantageously elevated. However, the rotation number is usually the upper limit specified for the apparatus or lower and, for example, the rotation number is usually 3,000 rpm or less in the case of rotating a 12-inch circular silicon wafer substrate and 4,000 rpm or less in the case of rotating a 8-inch circular wafer substrate. The time period of rotating the substrate is preferably 5 seconds or more so as to complete the drying. The rotation time is preferably longer but in order to elevate the throughput, the rotation number can be set by taking account of the time period or number of units necessary for other steps such as exposure, PEB and development.

The step (b'1) of removing the pre-wet solution penetrated into the resist film may also be performed immediately after the pre-wet step (b) of spreading a pre-wet solution on the resist film and after a fixed time, rotating the substrate to remove the pre-wet solution. In this case, it is preferred that the rotation of substrate to remove the pre-wet solution in the first pre-wet step (b) is performed at a relatively low rotation speed of 100 to 2,000 rpm and by immediately elevating the substrate rotation speed to 3,000 to 4,000 rpm, the step (b'1) of removing the pre-wet solution penetrated into the resist film is performed.

The interior of the apparatus is preferably exhausted so as to expel the vaporized pre-wet solution outside the apparatus and at this time, the exhaust pressure is preferably 20 Pa or more.

The apparatus for rotating the substrate may be any apparatus as long as it has a mechanism of rotating the substrate, but a developing apparatus which is a general apparatus for the production of a device such as semiconductor, liquid crystal, thermal head and the like is preferred because the delivery of the substrate from the exposure apparatus to the developing apparatus is simple and easy. However, the present invention is not limited thereto.

In the case of the step (b'2) of baking (heating) the resist film and thereby removing the pre-wet solution, if the resin partially undergoes a structural change, a chemical reaction takes place while the pre-wet solution is being present in the resist film and this gives rise to non-uniform progress of chemical reaction from the bottom to the surface of the resist film in the later step (d) of heating the resist film (PEB step). Therefore, the baking temperature is preferably a temperature of causing no chemical change in the resist resin.

In this way, the baking temperature must be a temperature where the resist resin is not chemically changed. The temperature at which the resin used for the resist undergoes a chemical change varies depending on the kind of resist, but commercially available resists each has a recommendable post-baking temperature (that is, PEB temperature) which is generally from 90 to 150° C., and a reaction of changing the alkali-insoluble group into an alkali-soluble group at the recommendable post-baking temperature or more is efficient.

Accordingly, the temperature at the baking for removing the immersion liquid, which is a temperature of not changing the alkali-insoluble group into an alkali-soluble group, is preferably 20° C. or more lower than the heating temperature in the step (d).

The minimum necessary temperature varies depending on the kind of the pre-wet solution but in the case of using water as the pre-wet solution, the heating is preferably performed at a temperature of 40° C. or more.

The heating time is preferably from 10 to 120 seconds, because if too short, the removal of pre-wet solution cannot be completed, whereas if excessively long, this affects the throughput.

The interior of the apparatus is preferably exhausted so as to expel the vaporized pre-wet solution outside the apparatus and at this time, the exhaust pressure is preferably 3 Pa or more. The apparatus for heating the substrate may be any apparatus as long as it has a heating mechanism, but a heating unit attached to a developing apparatus which is a general apparatus for the production of a device such as semiconductor, liquid crystal and thermal head is preferred because the delivery of the substrate from the exposure apparatus to the developing apparatus is simple and easy. However, the present invention is not limited thereto.

The amount of the pre-wet solution remaining in the resist film after the step (b') of removing the pre-wet solution component penetrated into the resist film is preferably 0.1 weight % or less, more preferably 0.01 weight % or less.

As for the method of measuring the moisture amount, in the case where the pre-wet solution is water or an aqueous solution, a method of scraping off the resist film coated on the substrate by using a spatula or the like and measuring the moisture amount by a Karl Fischer moisture meter (for example, MKS-500, manufactured by Kyoto Electronics Manufacturing Co., Ltd.) may be used. In the case where the pre-wet solution is a non-aqueous solution, a method of dissolving the scraped resist film in a solvent such as cyclohexanone and measuring the moisture amount by gas chromatography (for example, GC-17Aver.3, manufactured by Shimadzu Corporation) may be used.

In the pattern forming method of the present invention, after the immersion exposure step (c) of subjecting the resist film on the substrate to exposure through an immersion liquid, (d) a step of heating the resist film and (e) a step of developing the resist film are usually performed.

The step (a) of forming a resist film on a substrate, the step (c) of subjecting the resist film on the substrate to exposure through an immersion liquid, the step (d) of heating the resist film and the step (e) of developing the resist film each can be performed by a generally known method.

Also, (c") a step of removing the immersion liquid components intruded into the resist film may be performed after the step (c) of exposing the resist film through an immersion liquid is performed and then the immersion liquid on the wafer is removed by a nozzle or the like. The step (c") may also be performed directly without removing the immersion liquid on the wafer. The method of removing the immersion liquid components intruded into the resist film includes (c"1) a method of rotating and thereby spin-drying the substrate after the immersion exposure and (c"2) a method of heating and thereby drying the substrate after the immersion exposure. These methods may be performed in the same manner as the method (b'1) of rotating and thereby spin-drying the substrate and the method (b'2) of heating and thereby drying the resist film, respectively, which are described above as the step (b') of removing the pre-wet solution penetrated into the resist film in the pre-wet step.

[(c) Immersion Exposure Step]

The wavelength of light source used in the exposure apparatus for immersion exposure of the present invention is not particularly limited, but studies of immersion exposure at an ArF excimer laser wavelength (193 nm) and an $F_2$ excimer laser wavelength have been started and both can be applied to the present invention.

The immersion liquid is preferably a liquid transparent to light at the exposure wavelength and having a temperature constant of refractive index as small as possible so as to minimize the distortion of an optical image projected on the resist. Particularly, when the exposure light source is an ArF excimer laser (wavelength: 193 nm), water is preferred in terms of easy availability and easy handleability in addition to the above-described aspects. When the exposure light source is an $F_2$ excimer laser, a fluorine-based organic solvent is preferred in view of transparency to light at the exposure wavelength.

In the case of using water as the immersion liquid, an additive (liquid) capable of decreasing the surface tension of water and increasing the surface activity may be used at a small ratio. This additive is preferably a substance which does not dissolve the resist layer on the wafer and at the same time, gives only a negligible effect on the optical coat on the lower surface of the lens element.

Preferred examples of such an additive include an aliphatic alcohol having a refractive index nearly equal to that of water, and specific examples thereof include methyl alcohol, ethyl alcohol and isopropyl alcohol. The addition of an alcohol having a refractive index nearly equal to that of water is advantageous in that even when the alcohol component in water is evaporated and the content concentration thereof is changed, the entire liquid can be made to undergo a very small change in the refractive index.

On the other hand, if a substance opaque to light at 193 nm or an impurity greatly differing in the refractive index from water is mingled, this incurs distortion of the optical image projected on the resist. Therefore, the water used is preferably distilled water. Pure water obtained by further filtering it through an ion exchange filter or the like may also be used.

[Resist]

The resist for use in the pattern forming method of the present invention is not particularly limited as long as it is a resist for exposure wavelength used in the immersion exposure, but is preferably a chemical amplification-type resist containing a compound (photoacid generator) of generation an acid upon irradiation with actinic rays or radiation such as KrF excimer laser light, ArF excimer laser light and $F_2$ excimer laser light, and a resin which decomposes under the action of an acid and becomes soluble in an alkali developer.

In the case of using a resist having high affinity for the immersion liquid, the probability of causing the elution of components such as photoacid generator from the resist film is high and therefore, the effect by the pattern forming method of the present invention is remarkable. The affinity of the resist for the immersion liquid can be estimated by a method of dropping a few micro-liter of an immersion liquid on the resist film formed on a substrate and measuring the contact angle between the dropped immersion liquid and the resist film, or a method of immersing the resist film formed on a substrate in an immersion liquid for a predetermined time, vertically erecting the substrate plane in air, and measuring the time period from the moment of vertical erection in air until disappearance of the immersion liquid from the resist surface (hereinafter referred to as "wettability"). As the value of the contact angle is smaller, the affinity for immersion liquid is higher, and as the value of wettability is larger, the affinity for immersion liquid is higher.

In the case of a resist for ArF excimer laser, the effect of the present invention is remarkable when a resist of giving a contact angle of 75° or less or a wettability of 3 seconds or more after exposure is used. A remarkable effect is obtained either when the resist has a contact angle of 75° or more and a wettability of 3 seconds or more or when the resist has a wettability of 3 seconds or less and a contact angle of 75° or less.

It is considered that the same applies to the resist for $F_2$ excimer laser.

In the pattern forming method of the present invention, the substrate on which the resist film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a circuit board of liquid crystal, thermal head or the like or in the lithography step of other photo-application processes can be used. If desired, an organic antireflection film may be formed between the resist film and the substrate.

Examples of the alkali developer which can be used in the step of performing the development include an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, or a cyclic amine such as pyrrole and piperidine.

In such an alkaline aqueous solution, an alcohol and a surfactant may also be added each in an appropriate amount.

The alkali concentration of the alkali developer is usually from 0.1 to 20 weight %. The pH of the alkali developer is usually from 10.0 to 15.0.

As for the rinsing solution, pure water may be used and this may be used after adding an appropriate amount of surfactant.

After the development or rinsing, the developer or rinsing solution adhering on the pattern may removed by a supercritical fluid.

EXAMPLES

The present invention is described in greater detail below by referring to Examples, but the present invention is not limited thereto.

(Synthesis of Resin (1) for Resist Composition)

2-Methyl-2-adamantyl methacrylate and mevalonic lactone methacrylate were charged at a ratio of 45/55 (by mol) and dissolved in tetrahydrofuran to prepare 100 mL of a solution having a solid content concentration of 20 weight %. Subsequently, 2 mol % of polymerization initiator V-65 produced by Wako Pure Chemical Industries, Ltd. and 4 mol % of mercaptoethanol were added to the solution obtained above, and the resulting solution was added dropwise to 10 mL of tetrahydrofuran heated to 60° C. over 2 hours in a nitrogen atmosphere. After the completion of dropwise addition, the reaction solution was heated and stirred for 6 hours. When the reaction was completed, the reaction solution was cooled to room temperature and crystallized from 3 L of methanol, and the precipitated white powder was recovered. The polymer compositional ratio determined from C$^{13}$-NMR was 51/49 (by mol), the weight average molecular weight in terms of standard polystyrene determined by the gas permeation chromatography (GPC) measurement was 9,700, and the dispersity (Mw/Mn) was 1.97. Resins (2) to (26) were synthesized in the same manner.

The structure, weight average molecular weight and dispersity of each of Resins (1) to (28) used in Examples are shown together below.

(1)

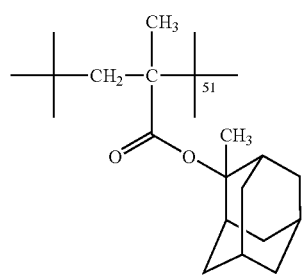

(2)

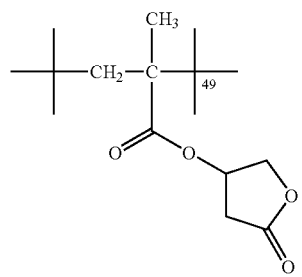

Mw = 9700
Mw/Mn = 1.97

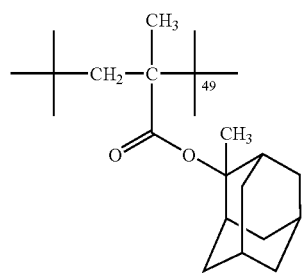

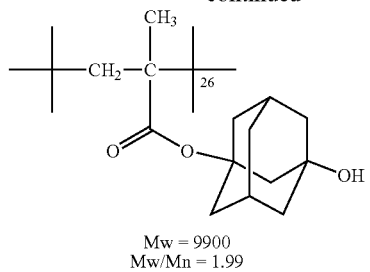

Mw = 9900
Mw/Mn = 1.99

(3)

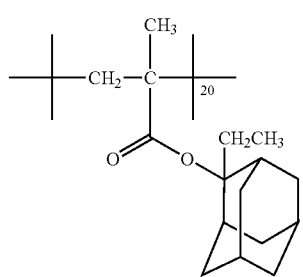

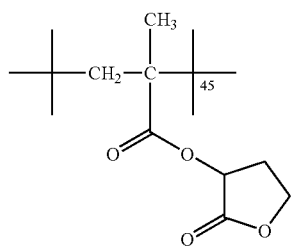

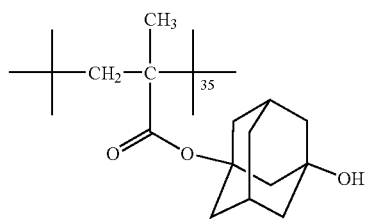

Mw = 9200
Mw/Mn = 2.04

(4)

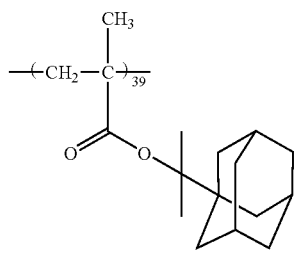

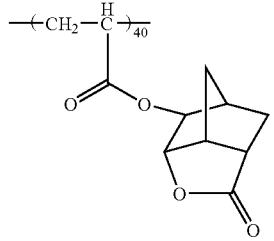

-continued
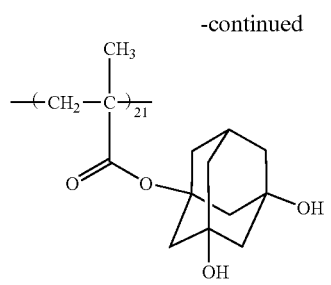
Mw = 9700
Mw/Mn = 2.01
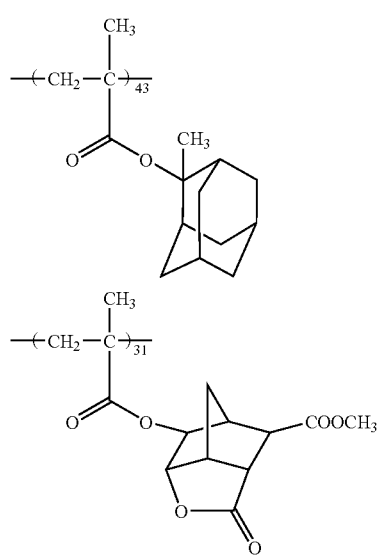
Mw = 8200
Mw/Mn = 1.91
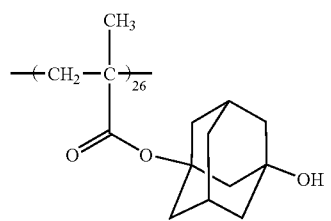
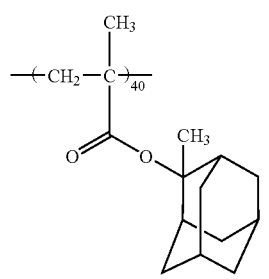
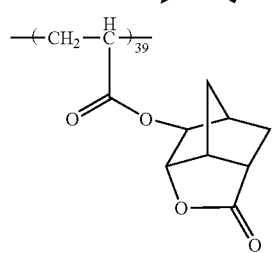
-continued
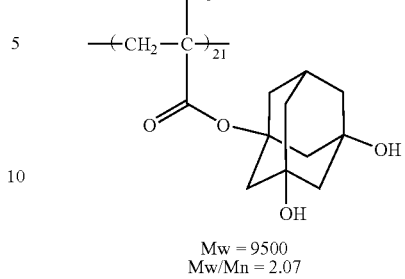
Mw = 9500
Mw/Mn = 2.07
(5)
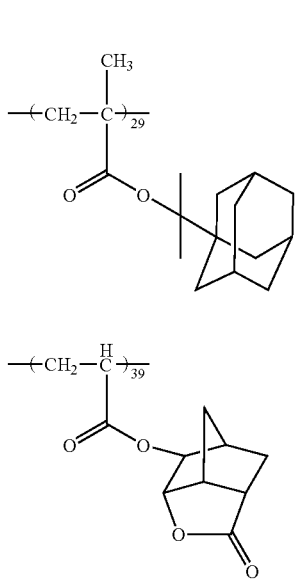
(6)
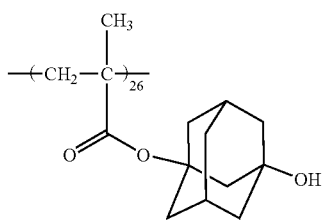
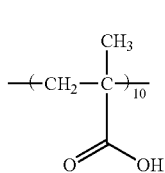
Mw = 8700
Mw/Mn = 1.98
(7)
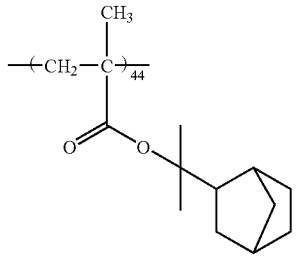
(8)

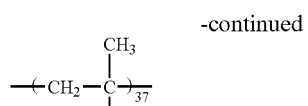
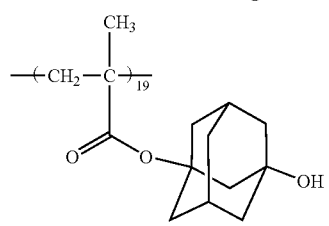
Mw = 10300
Mw/Mn = 2.16
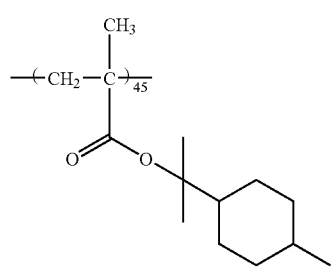
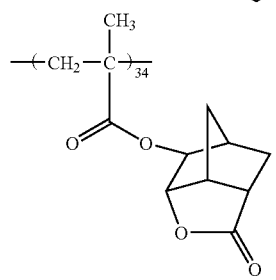
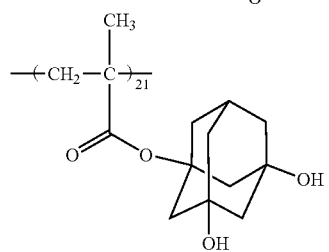
Mw = 11300
Mw/Mn = 2.21
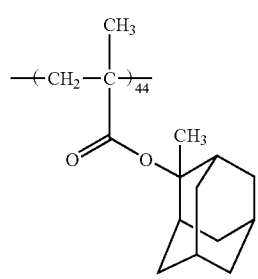
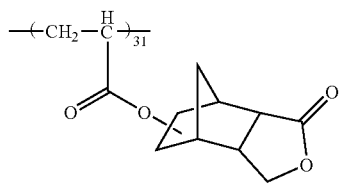
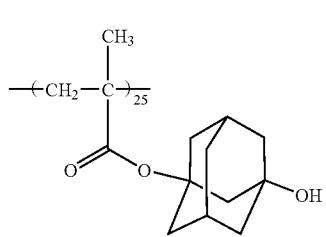
Mw = 8300
Mw/Mn = 1.97
(9)
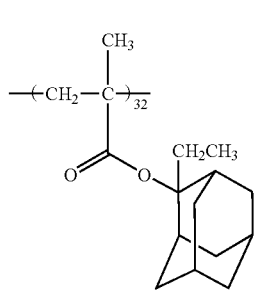
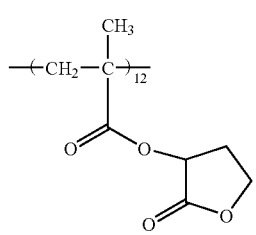
(10)
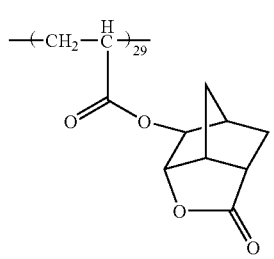
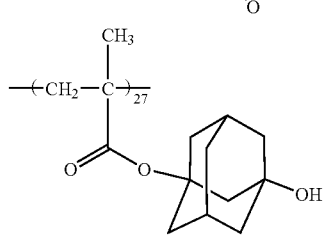
Mw = 10200
Mw/Mn = 2.31
(11)

-continued
(12)
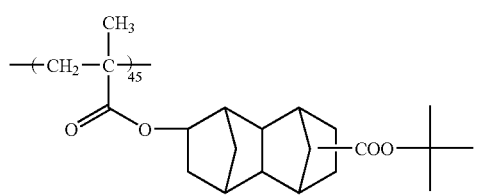
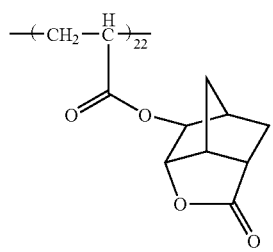
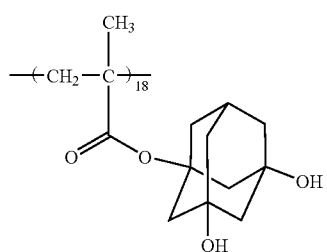
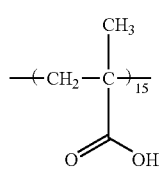
Mw = 8700
Mw/Mn = 2.23
(13)
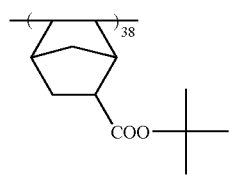
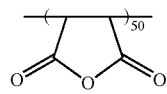
Mw = 7100
Mw/Mn = 2.42
(14)
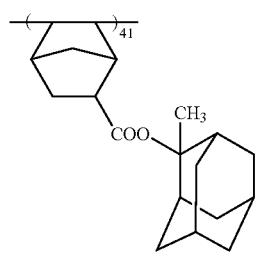
-continued
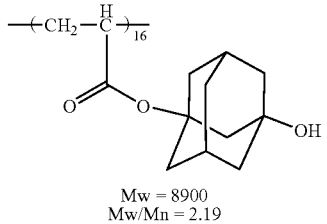
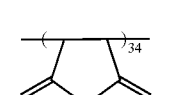
Mw = 8900
Mw/Mn = 2.19
(15)
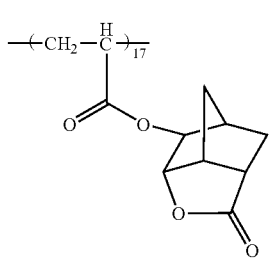
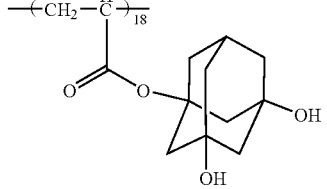
Mw = 11100
Mw/Mn = 2.37
(16)
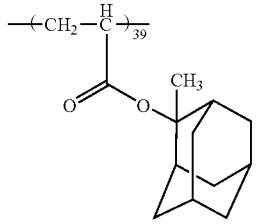
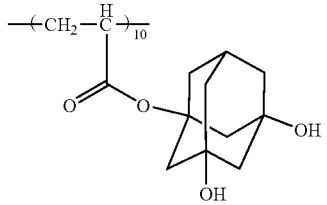
Mw = 10400
Mw/Mn = 2.51

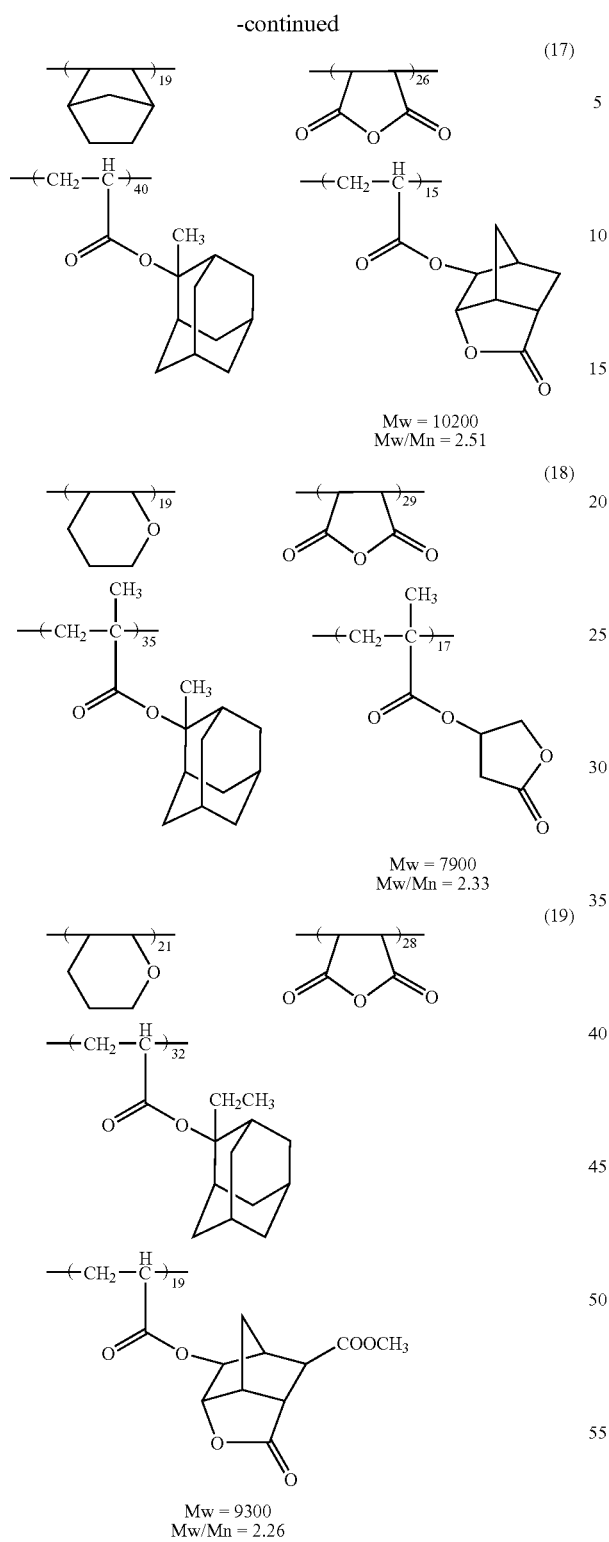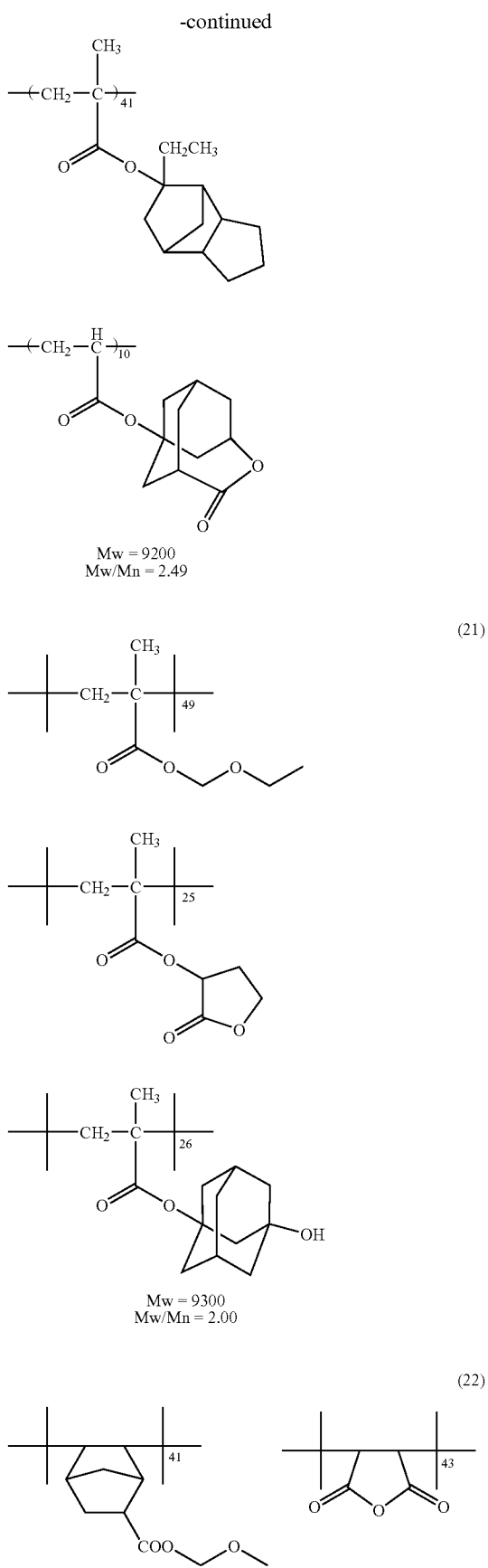

-continued
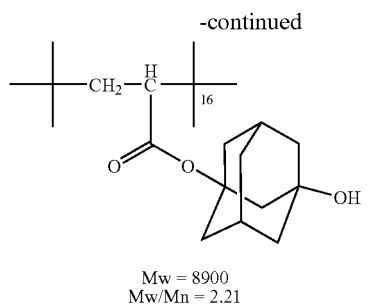
Mw = 8900
Mw/Mn = 2.21
(23)
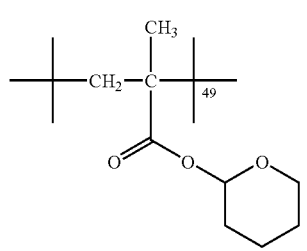
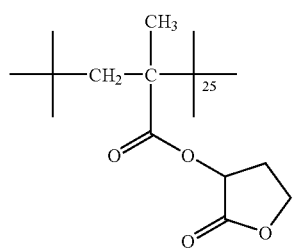
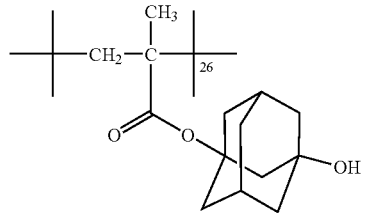
Mw = 10100
Mw/Mn = 2.04
(24)
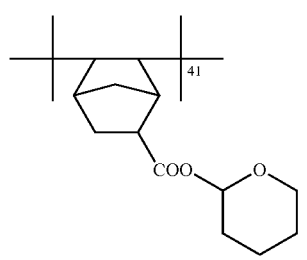
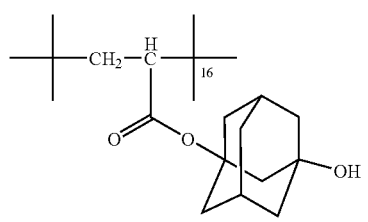
Mw = 8800
Mw/Mn = 1.98
-continued
(25)
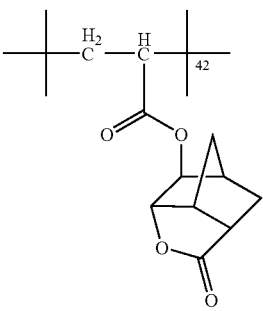
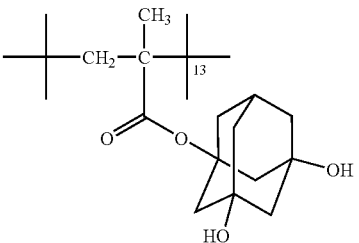
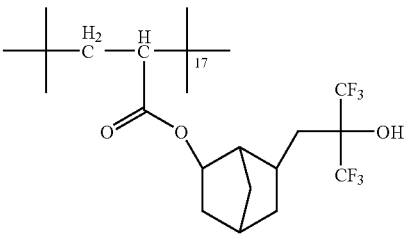
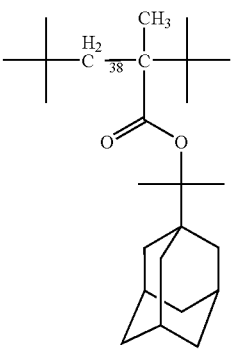
Mw = 9800
Mw/Mn = 2.01
(26)
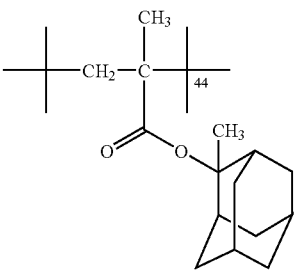

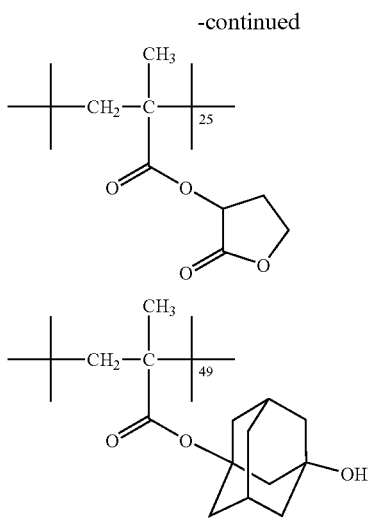

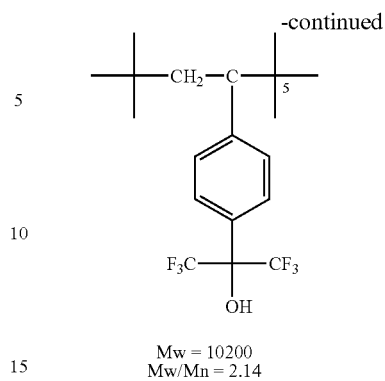

Mw = 10200
Mw/Mn = 2.14

[Preparation of Resist Compositions 1 to 34]

The components shown in Table 1 below were dissolved in a solvent to prepare a solution having a solid content concentration of 6 weight %, and the obtained solution was filtered through a polyethylene filter having a pore diameter of 0.1 μm to prepare a positive resist solution.

TABLE 1

| Resist | Resin 2 g | Photoacid Generator 0.2 μmol | Dissolution Inhibitor 0.1 g | Solvent | Basic Compound 0.07 μmol | Surfactant 5 mg |
|---|---|---|---|---|---|---|
| 1 | 1 | Z1 | | SL-2/4 = 50/50 | N-1 | W-1 |
| 2 | 2 | Z2 | | SL-2/4 = 50/50 | N-2 | W-2 |
| 3 | 3 | Z28 | | SL-1/4/8 = 40/58/2 | N-3 | W-3 |
| 4 | 4 | Z38 | | SL-2/4 = 40/60 | none | W-4 |
| 5 | 5 | Z2 | | SL-2/4 = 40/60 | N-2 | none |
| 6 | 6 | Z24/Z38 = 1/2 | | SL-2/4/9 = 40/59/1 | N-1/3 = 1/1 | W-4 |
| 7 | 7 | Z2/Z9 = 4/1 | | SL-2/4 = 50/50 | N-1 | W-1 |
| 8 | 8 | Z16 | | SL-2/6 = 70/30 | N-3/6 = 1/1 | W-1 |
| 9 | 9 | Z36/Z38 = 1/4 | | SL-2/4/9 = 40/59/1 | N-2 | W-1 |
| 10 | 10 | Z14 | | SL-2/4 = 40/60 | N-3 | W-2 |
| 11 | 11 | Z1/Z32 = 3/1 | | SL-3/4 = 40/60 | N-1 | W-3 |
| 12 | 12 | Z31 | | SL-2/4 = 40/60 | N-1 | W-4 |
| 13 | 13 | Z38 | I-1 | SL-1/7 = 40/60 | N-6 | W-4 |
| 14 | 14 | Z38 | | SL-4/6 = 60/40 | N-1 | W-1 |
| 15 | 15 | Z14 | | SL-3/7 = 60/40 | N-4/6 = 1/1 | W-3 |
| 16 | 16 | Z27 | | SL-2/5 = 60/40 | N-3 | W-2 |
| 17 | 17 | Z15 | I-2 | SL-2/7 = 60/40 | N-3 | W-2 |
| 18 | 18 | Z2/Z24 = 4/1 | | SL-2/7 = 60/40 | N-4/6 = 1/1 | W-1 |
| 19 | 19 | Z13/Z9 = 3/1 | | SL-2/7 = 60/40 | none | W-1 |
| 20 | 20 | Z13 | | SL-2/4 = 40/60 | N-3 | W-4 |
| 21 | 21 | Z13 | | SL-2 | N-6 | none |
| 22 | 22 | Z2 | | SL-2/4 = 50/50 | N-2 | W-2 |
| 23 | 23 | Z38 | | SL-4/6 = 60/40 | N-1 | W-1 |
| 24 | 24 | Z2 | | SL-2/4 = 50/50 | N-2 | W-2 |
| 25 | 25 | Z38 | | SL-4/6 = 60/40 | N-1 | W-1 |
| 26 | 26 | Z1 | | SL-2/4 = 50/50 | N-1 | W-1 |
| 27 | 4 | Z2 | | SL-4/6 = 60/40 | N-3 | W-5 |
| 28 | 4 | Z32 | | SL-4/6 = 60/40 | N-1 | W-5 |
| 29 | 7 | Z2 | | SL-4/6 = 60/40 | N-3 | W-5 |
| 30 | 7 | Z32 | | SL-4/6 = 60/40 | N-1 | W-5 |
| 31 | 9 | Z2 | | SL-4/6 = 80/20 | N-4 | W-5 |
| 32 | 9 | Z32 | | SL-4/6 = 80/20 | N-4 | W-5 |
| 33 | 13 | Z2 | I-1(0.20) | SL-2/4 = 40/60 | N-2 | W-5 |
| 34 | 13 | Z32 | | SL-2/4 = 40/60 | N-6 | W-5 |

In the Table, symbols for components are as follows.
Z1: triphenylsulfonium triflate
Z2: triphenylsulfonium nonaflate
Z9: triphenylsulfonium acetate
Z13: tris(p-tert-butylphenyl)sulfonium nonaflate
Z14: (p-cyclohexylphenyl)diphenylsulfonium nonaflate
Z15: (p-tert-butylphenyl)diphenylsulfonium nonaflate
Z16: (p-butoxyphenyl)diphenylsulfonium nonaflate Z24
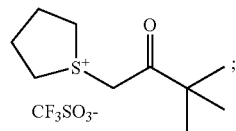

Z27
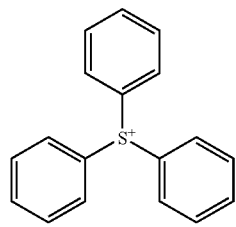 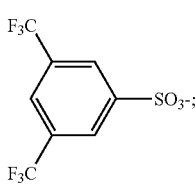

Z28
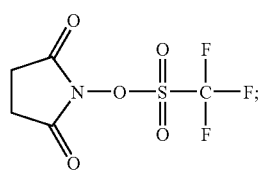

Z31
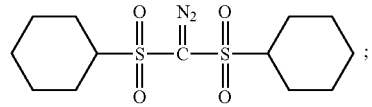

Z32
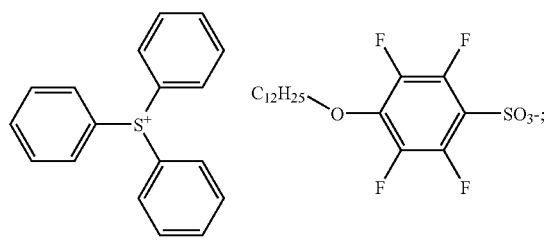

Z36

Z38: (p-tolyl)diphenylsulfonium nonaflate
N-1: N,N-dibutylaniline
N-2: N,N-dipropylaniline
N-3: N,N-dihydroxyethylaniline
N-4: 2,4,5-triphenylimidazole
N-5: 2,6-diisopropylaniline
N-6: hydroxyantipyrine
W-1: Megafac F176 (produced by Dainippon Ink & Chemicals, Inc.) (fluorine-containing surfactant)
W-2: Megafac R08 ((produced by Dainippon Ink & Chemicals, Inc.) (fluorine and silicon-containing surfactant)
W-3: polysiloxane polymer KP-341 (produced by Shin-Etsu Chemical Co., Ltd.) (silicon-containing surfactant)
W-4: Troysol S-366 (produced by Troy Chemical)
W-5: PF-6520(produced by Omnova Solution Inc.)
SL-1: cyclopentanone
SL-2: cyclohexanone
SL-3: 2-methylcyclohexanone
SL-4: propylene glycol monomethyl ether acetate
SL-5: ethyl lactate
SL-6: propylene glycol monomethyl ether
SL-7: 2-heptanone
SL-8: γ-butyrolactone
SL-9: propylene carbonate
I-1: tert-butyl lithocholate
I-2: tert-butyl adamantanecarboxylate In the Table, when a plurality of resins or solvents are used, the ratio is a ratio by weight, and when a plurality of photoacid generators or basic compounds are used, the ratio is a ratio by mol.

[Evaluation of Elution Amount of Generated Acid]

The resist composition prepared was coated on a 8-inch silicon wafer and baked at 115° C. for 60 seconds to form a 150 nm-thick resist film. Subsequently, pure water was spread on the resist film to effect pre-wetting and then, the wafer was rotated at a rotation number of 500 rpm for 20 seconds to shake off the pure water on the wafer. Thereafter, as the step of removing the pre-wet solution (pure water here) penetrated into the resist film, a. a step of rotating the wafer at a rotation number of 4,000 rpm for 20 seconds and thereby spin-drying the wafer, or b. a step of placing the wafer on a hot plate at 100° C. for 30 seconds to heat and dry the wafer was appropriately applied.

The entire surface of the resulting 8-inch wafer was exposed with light of 50 Jm/cm² by using an ArF excimer laser exposure machine (PAS5500/1100, manufactured by ASML) and on this resist film, 5 ml of pure water deionized by using an ultrapure water producing apparatus (Milli-QJr., manufactured by Nihon Millipore Ltd.) was dropped. The water was allowed to stay on the resist film for 50 seconds and then sampled, and the elution concentration of acid was determined by LC-MS.

LC Apparatus: 2695 manufactured by Waters
MS Apparatus: esquire 3000plus manufactured by Bruker Daltonics The MS detection intensity of anion species of the photoacid generator (PAG) contained in each resist was measured under the above-described conditions, and the elution ratio of PAG to the initially added amount of PAG was calculated.

[Evaluation of Fluctuation Ratio of Sensitivity According to Immersion Time]

An antireflection film (ARC25, produced by Brewer Science, Inc.) was uniformly coated on a silicon substrate to a thickness of 600 Å by a spin coater and then dried at 190° C. for 240 seconds, and each positive resist solution was coated thereon by a spin coater. The resulting wafer was dried under heating at 115° C. for 60 seconds to form a 0.20 μm-thick resist film and after spreading pure water on this resist film to effect pre-wetting, rotated at a rotation number of 500 rpm for 20 seconds to shake off the pure water on the wafer. Subsequently, as the step of removing the pre-wet solution (pure water here) penetrated into the resist film, (1) a step of rotating the wafer at a rotation number of 4,000 rpm for 20 seconds and thereby spin-drying the wafer, or (2) a step of placing the wafer on a hot plate at 100° C. for 30 seconds to heat and dry the wafer was appropriately applied. Thereafter, the immersion exposure sensitivity at the exposure of 193 nm was evaluated by using an immersion exposure dissolution behavior analyzer IMES-5500 (manufactured by Litho Tech Japan Corp.) (sensitivity in once water immersion). Separately, a resist film was formed on a silicon substrate in the same manner, subjected to exposure of 193 nm by using an immersion exposure dissolution behavior analyzer IMES-5500 (manufactured by Litho Tech Japan Corp.) and again immersed in water for 10 seconds, and the sensitivity was evaluated (sensitivity in twice water immersion).

The sensitivity as used herein means a minimum exposure value of giving a film thickness of 0 when the wafer after exposure is dried under heating at 120° C. for 60 seconds, developed at 23° C. for 30 seconds by using an aqueous 2.38 weight % tetramethylammonium hydroxide solution, rinsed with pure water for 30 seconds and dried and the film thickness is measured.

The fluctuation ratio of sensitivity in once water immersion or twice water immersion was calculated according to the following formula and used as an index for the immersion time dependency. As this value is larger, the fluctuation of sensitivity according to the immersion time is larger and the fear of impairing the wafer in-plane uniformity at the exposure by a local fill-type immersion scanner exposure machine is greater.

Fluctuation ratio of sensitivity (%)=|(sensitivity in twice water immersion−sensitivity in once water immersion)/sensitivity in once water immersion|×100

The resist compositions used for evaluation and the evaluation results thereof are shown together in Table 2. In the column of Step (b') of Table 2, which method (1) or (2) was used as the step of removing the pre-wet solution (pure water here) penetrated into the resist film is shown. The blank column indicates that the step (b') was not performed.

TABLE 2

| | Conditions | | | | Evaluation | |
|---|---|---|---|---|---|---|
| | | Pre-Wet Time (sec) | Rotation Number in Shaking Off Pre-Wet Solution (rpm) | Step (b') | Elution Ratio of Anion Species of PAG (mol %) | Sensitivity Fluctuation Ratio (%) |
| Resist | | | | | | |
| Example 1 | 1 | 30 | 1500 | | 3.0 | 65 |
| Example 2 | 1 | 60 | 1500 | | 1.0 | 20 |
| Example 3 | 1 | 120 | 1500 | | 0.8 | 16 |
| Example 4 | 1 | 180 | 1500 | | 0.6 | 12 |
| Example 5 | 1 | 180 | 1000 | | 0.6 | 8 |
| Example 6 | 1 | 180 | 1000 | (1) | 0.1 | 1 |
| Example 7 | 1 | 180 | 1000 | (2) | 0.0 | 0 |
| Example 8 | 2 | 180 | 750 | (2) | 0.4 | 1 |
| Example 9 | 2 | 30 | 750 | | 1.5 | 50 |
| Example 10 | 2 | 180 | 3000 | | 0.2 | 20 |
| Example 11 | 3 | 120 | 750 | (1) | 0.6 | 10 |
| Example 12 | 3 | 30 | 750 | (2) | 1.5 | 60 |
| Example 13 | 3 | 180 | 750 | (2) | 0.3 | 4 |
| Example 14 | 4 | 30 | 1500 | | 2.0 | 80 |
| Example 15 | 4 | 60 | 1500 | | 1.8 | 31 |
| Example 16 | 4 | 120 | 1500 | | 1.0 | 13 |
| Example 17 | 4 | 180 | 1500 | | 0.5 | 7 |
| Example 18 | 4 | 180 | 800 | | 0.3 | 4 |
| Example 19 | 4 | 180 | 800 | (2) | 0.1 | 2 |
| Example 20 | 4 | 180 | 800 | (1) | 0.0 | 0 |
| Example 21 | 5 | 60 | 750 | (1) | 1.0 | 8 |
| Example 22 | 6 | 120 | 750 | (1) | 0.4 | 3 |
| Example 23 | 7 | 180 | 800 | (2) | 0.2 | 5 |
| Example 24 | 8 | 150 | 750 | (1) | 0.4 | 5 |
| Example 25 | 9 | 120 | 750 | (1) | 0.2 | 2 |
| Example 26 | 10 | 180 | 800 | (2) | 0.0 | 0 |
| Example 27 | 11 | 120 | 900 | (2) | 0.4 | 3 |
| Example 28 | 12 | 180 | 750 | (2) | 0.1 | 1 |
| Example 29 | 13 | 120 | 800 | (1) | 0.5 | 5 |
| Example 30 | 14 | 120 | 800 | (1) | 0.5 | 2 |
| Example 31 | 15 | 180 | 750 | (2) | 0.0 | 0 |
| Example 32 | 16 | 60 | 500 | (1) | 0.9 | 10 |
| Example 33 | 17 | 180 | 1000 | (2) | 0.1 | 10 |
| Example 34 | 18 | 120 | 500 | (2) | 0.5 | 8 |
| Example 35 | 19 | 180 | 750 | (2) | 0.1 | 0 |
| Example 36 | 20 | 120 | 500 | (2) | 0.5 | 9 |
| Example 37 | 21 | 90 | 800 | (1) | 1.0 | 15 |
| Example 38 | 22 | 120 | 500 | (2) | 0.5 | 8 |
| Example 39 | 23 | 90 | 500 | (1) | 1.0 | 11 |
| Example 40 | 24 | 120 | 500 | (2) | 0.3 | 2 |
| Example 41 | 25 | 30 | 500 | (2) | 1.5 | 85 |
| Example 42 | 25 | 60 | 500 | (2) | 1.0 | 20 |
| Example 43 | 25 | 120 | 500 | (2) | 0.7 | 14 |
| Example 44 | 25 | 180 | 500 | (2) | 0.1 | 2 |
| Example 45 | 25 | 180 | 750 | (2) | 0.0 | 0 |
| Example 46 | 25 | 180 | 750 | (1) | 0.1 | 1 |
| Example 47 | 26 | 180 | 800 | (2) | 0.1 | 1 |
| Example 48 | 27 | 60 | 800 | (1) | 1.0 | 8 |
| Example 49 | 28 | 60 | 800 | | 0.2 | 3 |
| Example 50 | 29 | 60 | 800 | | 1.2 | 7 |
| Example 51 | 30 | 60 | 800 | | 0.8 | 4 |
| Example 52 | 31 | 60 | 800 | | 0.8 | 9 |
| Example 53 | 32 | 60 | 800 | | 0.1 | 5 |
| Example 54 | 33 | 60 | 800 | (2) | 1.8 | 15 |
| Example 55 | 34 | 60 | 800 | | 0.3 | 10 |
| Comparative Example 1 | 1 | pre-wetting was not performed | | | 4.8 | 85 |

As seen from the results of Examples 1 to 55 in Table 2, when the pattern forming method of the present invention is performed, the elution of acid into the immersion liquid less occurs and the change in sensitivity according to the immersion time is decreased.

What is claimed is:

1. A pattern forming method comprising, in this order, (a) a step of forming a resist film on a substrate, (b) a pre-wet step of spreading a pre-wet solution on the resist film and after a time, removing the pre-wet solution, and (c) a step of exposing the resist film on the substrate to an ArF excimer laser having a wavelength of 193 nm as an exposure light source through an immersion liquid, wherein the pre-wet step (b) is a step of spreading a pre-wet solution on the resist film and after a time, rotating the substrate to shake off and remove the pre-wet solution.

2. The pattern forming method according to claim 1, wherein in the pre-wet step (b), the time after spreading the pre-wet solution on the resist film until removing the pre-wet solution is from 60 to 600 seconds.

3. The pattern forming method according to claim 1, wherein in the pre-wet step (b), the time after spreading the pre-wet solution on the resist film until removing the pre-wet solution is from 120 to 480 seconds.

4. The pattern forming method according to claim 1, wherein in the pre-wet step (b), the time after spreading the pre-wet solution on the resist film until removing the pre-wet solution is from 180 to 300 seconds.

5. The pattern forming method according to claim 1, wherein in the pre-wet step (b), a rotation speed at the time of rotating the substrate to shake off and remove the pre-wet solution is from 100 to 2,000 rpm.

6. The pattern forming method according to claim 5, wherein in the pre-wet step (b), the rotation speed at the time of rotating the substrate to shake off and remove the pre-wet solution is from 500 to 1,000 rpm.

7. The pattern forming method according to claim 1, which further comprises (b') a step of removing the pre-wet solution penetrated into the resist film after the pre-wet step (b).

8. The pattern forming method according to claim 7, wherein the step (b') of removing the pre-wet solution penetrated into the resist film is (b'1) a step of rotating the substrate to dry the resist film.

9. The pattern forming method according to claim 7, wherein the step (b') of removing the pre-wet solution penetrated into the resist film is (b'2) a step of heating the resist film on a hot plate at 40 to 150° C. to dry the resist film.

10. The pattern forming method according to claim 1, wherein the pre-wet solution is water or a fluorine-based solvent.

11. The pattern forming method according to claim 1, wherein the pre-wet solution is pure water.

12. The pattern forming method according to claim 1, wherein the pre-wet solution is an immersion liquid.

13. A pattern forming method comprising, in this order, (a) a step of forming a resist film on a substrate, (b) a pre-wet step of spreading a pre-wet solution on the resist film and after a time, removing the pre-wet solution, and (c) a step of exposing the resist film on the substrate to an ArF excimer laser having a wavelength of 193 nm as an exposure light source through an immersion liquid, wherein the pre-wet solution is pure water.

* * * * *